United States Patent [19]

Cavigelli

[11] 4,075,572
[45] Feb. 21, 1978

[54] ISOLATION AMPLIFIER HAVING IMPROVED FIDELITY

[75] Inventor: George A. Cavigelli, Lexington, Mass.

[73] Assignee: American Optical Corporation, Southbridge, Mass.

[21] Appl. No.: 757,166

[22] Filed: Jan. 6, 1977

[51] Int. Cl.² ............................................... H03F 3/38
[52] U.S. Cl. ........................................ 330/10; 307/255
[58] Field of Search ...................... 330/9, 10; 307/240, 307/255

[56] References Cited

U.S. PATENT DOCUMENTS

| 2,838,675 | 6/1958 | Wanlass | 307/255 X |
| 3,156,859 | 11/1964 | Cox | 330/10 X |
| 3,825,773 | 7/1974 | Kivistik | 307/255 |
| 3,946,324 | 3/1976 | Smith | 330/10 |

Primary Examiner—James B. Mullins
Attorney, Agent, or Firm—Stephen A. Schneeberger; H. R. Berkenstock, Jr.

[57] ABSTRACT

An isolation amplifier comprising three separate conductively-isolated sections: (1) an input section including an AC modulator, (2) an output section including a demodulator, and (3) an improved oscillator or AC power section for reducing the undesirable effects of common mode interference signal sources coupled thereto through stray capacitance. The improved oscillator or power portion includes control elements for controlling the timing and direction of current conduction through the primary winding of a transformer having its secondary connected to the chopper or modulator. The control elements and circuitry associated therewith conduct in alternation and in a manner resulting substantially in conduction-overlap. Such conduction overlap is accomplished by means which accelerate initiation of conduction in one control element and possibly also retard the cessation of conduction in the other control element. In one embodiment, the conduction controlling circuitry of the AC power section includes two pairs of oppositely-conductive types of semi-conductors having their collector-emitter circuits connected in series with the transformer primary and across a DC power buss. Conduction-control of the respective semi-conductors is effected by a square wave control signal applied to the respective base elements thereof through respective speed-up capacitors.

3 Claims, 15 Drawing Figures

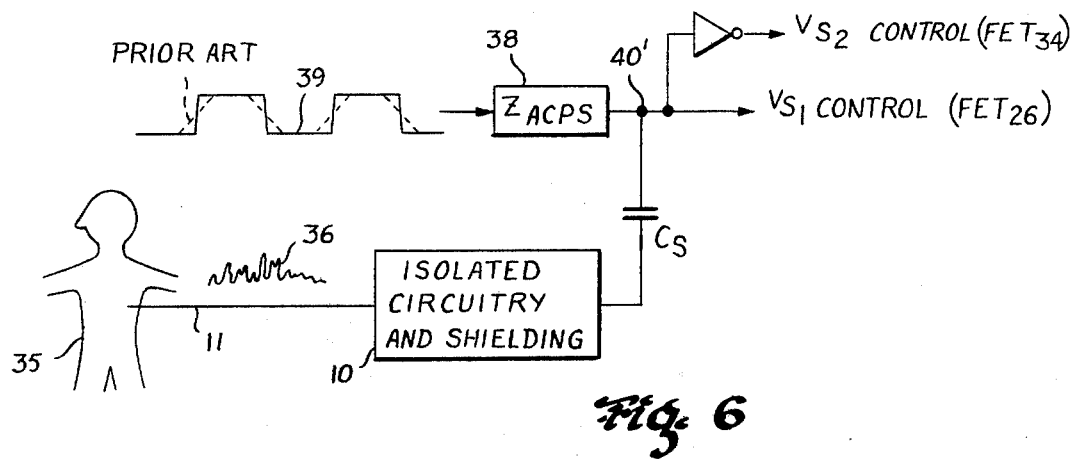
Fig. 6
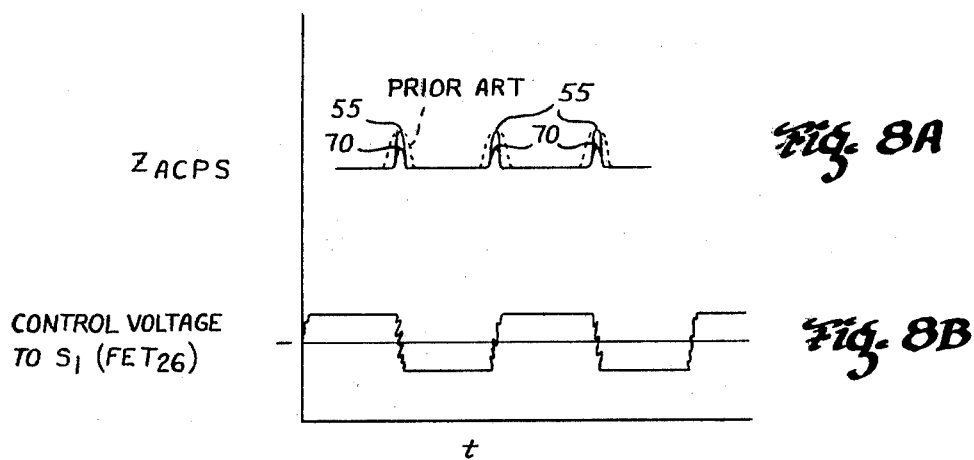
Fig. 8A
Fig. 8B
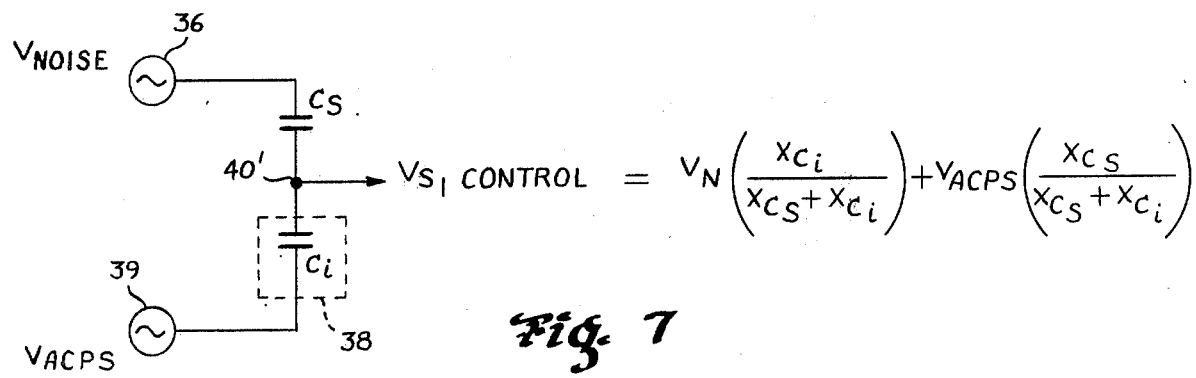
Fig. 7

ISOLATION AMPLIFIER HAVING IMPROVED FIDELITY

BACKGROUND OF THE INVENTION

The invention relates to electronic amplifiers and more particularly to isolation amplifiers having substantially no DC conductive paths between the input terminals and any of the surrounding ground, output, for power supply circuits. More particularly still, the invention relates to such amplifiers including circuit features to improve the fidelity with which the input signal is relayed to the output. This invention particularly relates to improvements in such isolation amplifiers as may be commonly utilized in the medical field.

Amplifiers have in the past been provided with circuit arrangements for effecting conductive isolation between different components or elements connected thereto. Although such amplifiers have served useful functions in some fields, typically they have not been capable of meeting the severe requirements of a number of unique and important applications. One such important application is in the medical field where for a variety of purposes electronic equipment must be connected to human patients to measure electrical impulses and the like, e.g. for taking electrocardiograms. It has become increasingly apparent that the conventional electronic equipment can, when connected to a human, cause serious injury or even death in the event of minor equipment malfunctions, operator error, or some other inadvertent event. Further, there are many other applications for high performance isolation amplifiers as for instance in the fields of industrial process control where it becomes necessary to isolate the signal source from the system output.

One such isolation amplifier which generally meets the aforementioned requirements for isolation in the medical and/or process control fields is described in U.S. Pat. No. 3,946,324. That isolation amplifier comprises an input portion for receiving the DC input signal and includes, in the input portion, an AC energized modulator to produce an AC signal substantially corresponding to the DC input signal. The amplifier further includes an output portion receiving the AC signal from the input portion, which output portion also includes a phase sensitive demodulator to produce a generally corresponding, relatively amplified DC output signal. A transformer serves to non-conductively couple the AC signal from the input portion to the output portion. The AC signal from the modulator and the phase sensitive detection thereof by the demodulator are controlled by an AC energizing signal from an AC power portion of the amplifier. The AC power portion includes circuitry for converting a DC power source to the AC energizing signal and further includes a transformer for non-conductively coupling the AC energizing signal to the input portion of the amplifier in order to activate the modulator. Further still, the AC energizing signal is connected or coupled to the demodulator in an appropriate phase relationship with the AC signal extended to the modulator.

The isolation amplifier of the aforementioned patent, while generally providing the degree of isolation required in the medical and other fields may, under certain circumstances, permit a degree of degradation of the signal transferred from the input to the output which may be unsuitable to the user's needs. For example, in the field of electrocardiography even very slight distortions in the output signal may be misinterpretted as normal or abnormal as the case may be. Because of the importance in interpreting such ECG signals, it is particularly important that the output signal be a faithful reproduction of the input signal from the patient's heart.

In accordance with the present invention, it is believed that such signal degradation occurs because the AC energizing signal which is generally of the shape of a square wave is generated in a manner which permits a disturbing effect thereon by high frequency common mode noise signals present in the operating environment. Such noise signals may exist in the operating environment and be picked up by the leads connecting the patient to the amplifier.

Accordingly, it is a principal object of this invention to provide an isolation amplifier of the type described and possessing improved fidelity in the transfer of the input signal to the output.

It is another object of the present invention to control the generation of the AC energizing signal in a manner which minimizes the adverse impact of high frequency common mode noise on the transfer fidelity of the amplifier.

These and other objects will be in part obvious and in part pointed out in greater detail hereinafter.

SUMMARY OF THE INVENTION

In accordance with the invention there is provided an isolation amplifier of the type providing a high degree of conductive isolation and in which the informational input signal appearing at the input of the isolated portion of the amplifier appears at the output with an improved and high degree of fidelity. The improved amplifier comprises an input portion for receiving a DC input signal and including an AC energized modulator to produce an AC signal substantially corresponding to the DC input signal, an output portion for receiving an AC signal from the input portion and including a phase sensitive demodulator to produce a corresponding, relatively amplified DC output signal, first circuit means for inductively non-conductively coupling the AC signal from the input portion to the output portion, an AC power portion for producing an AC energizing signal for the modulator and the demodulator, the power portion including means for generating the AC energizing signal and second circuit means for non-conductively coupling the AC energizing signal from the signal generating means to the input portion to activate the modulator, third circuit means for coupling the AC energizing signal from the power portion AC signal generating means to the output portion to activate the demodulator, the AC power portion exhibiting relatively low impedance during the opposite amplitude extremes of the AC cycle and normally a relatively higher cycle and normally a relatively higher impedance during the transition between the opposite amplitude extremes, the capacitive coupling of stray, common mode interference signal sources to the AC power portion being operative during the normally higher impedance thereof to modify the output voltage therefrom sufficiently to possibly interfere with the accurate reproduction of the input signal at the output; the improvement wherein the AC power portion comprises means for minimizing at least one of either the transition interval during which the relatively higher impedance of the power portion exists or the factor by which the relatively low impedance increases during the transition to thereby minimize any such modification in the power section output voltage.

In accordance with one embodiment of the invention, the means for generating the AC energizing signal includes an oscillator comprised of a free running multivibrator in which the cross- coupling networks between the respective switches of the multivibrator include not only a resistor but also a speed-up capacitor. Use of this speed-up capacitor serves to minimize the transition time between the conductive states of the complementary switches in the multivibrator and thereby minimizes the interval of high impedance in the power section during which the common mode interference signal may adversely effect the voltage applied to the modulator and/or demodulator. As used herein, the phrase "complementary switches" or "complementary pairs of switches" refers to a pair of switches operated in a complementary repetitive sequence.

In an alternate embodiment of the invention, two complementary pairs of semi-conductor switches are connected to opposite ends of the primary winding of the transformer which couples the AC energizing signal to the input portion and the modulator therein. Each switch of a complementary pair is operative to control current flow through the transformer primary in the direction opposite to that of the other. Accordingly, a switch in each of the two complementary pairs controls current flow in one direction while the opposite switch in each of the two complementary pairs controls current flow in the other direction. The conduction and non-conduction of the complementary pairs of switch means is controlled such that substantially full conduction through one switch means of a complementary pair is at least substantially concurrent with any significantly reduced conduction through the other switch means of that complementary pair thereby minimizing the increase of impedance of the AC power portion during the transition between AC extremes. The conduction control means may conveniently be provided by a pair of square wave control signals of opposite polarity extended to the control electrodes of the respective appropriate switches via respective connecting circuits which include the parallel combination of a resistor and a speed-up capacitor.

BRIEF DESCRIPTION OF THE DRAWINGS

FIG. 6 is a diagramatic illustration of the introduction of common mode interference signals through stray capacitance to the AC power supply voltage which controls the conduction of the modulator and demodulator switches;

FIG. 7 is a schematic diagram generally representative of the way in which interference signal voltage coupled to the AC power supply output via stray capacitance may distort the output voltage during conditions of high impedance;

FIG. 8A is a plot of the AC power supply impedance during switching transition according to the prior art and according to alternate embodiments of the present invention;

FIG. 8B is a plot of the AC power supply output voltage in the presence of common mode interference signals and utilizing the improved circuitry of the present invention.

DESCRIPTIONS OF THE PREFERRED EMBODIMENTS

Figure 1:
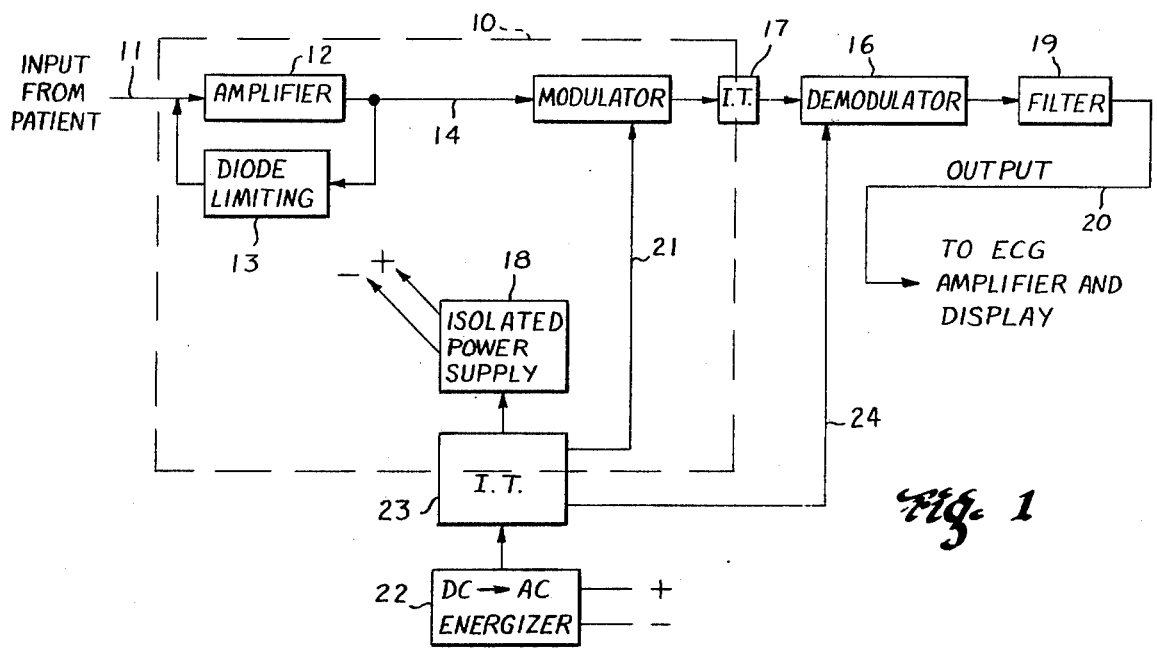
FIG. 1 is a symbolic block diagram of the isolation amplifier of the invention showing the inter-connections of the major portions thereof.

Referring now to the drawings particularly to FIG. 1, there is illustrated an isolation amplifier of the type generally described in the aforementioned U.S. 3,946,324 to which reference may be made for additional details. This isolation amplifier is particularly suited for receiving a low level DC signal from a patient (e.g. an EKG signal), for at least an initial stage of amplification and relay to further amplifiers and/or signal processing and/or display means. Most importantly, the isolation amplifier initially includes an isolated input portion 10 which serves to prevent a path for possible lethal leakage currents through the patient to ground. Although represented by a single input lead 11, it will be appreciated that the input to the input portion of the isolation amplifier is comprised of a pair of input leads across which the input signal is applied. Although the input impedance to the isolation amplifier is preferably very high, it may not require the high series resistance (e.g. 20 megohms) of the aforementioned U.S. patent inasmuch as such arrangement may be itself a source of noise.

The input portion 10 of the isolation amplifier includes an amplifier or preamplifier 12 to which the input signal 11 is connected. A diode limiter 13 is connected in feedback arrangement with the amplifier 12 to prevent large voltage excursion across the patient leads in case of circuit malfunction and also to prevent overloading of the modulator.

The output of amplifier 12 will be a replica of the slowly varying (DC) waveform appearing at the input 11 and is extended, via line 14, to the input of a modulator 15. The modulator 15, operated by an isolated AC power supply described hereinafter in greater detail, operates to convert the amplified DC input signal appearing on line 14 to an amplitude modulated carrier signal (e.g. 100 kilohertz) which is then non-conductively coupled to a demodulator 16 in a non-isolated output portion of the isolation amplifier. In the illustrated embodiment, the modulated signal is developed across the primary of an isolation transformer 17, the secondary of which transformer provides the input to the demodulator 16. In fact, the primary and secondary windings of transformer 17 may be considered part of modulator 15 and demodulator 16 respectfully. The DC supply voltages for the active elements of the amplifier stage 12 are derived from a floating rectifier power supply of known design and generally indicated as 18.

The amplitude of modulated carrier signal from modulator 15 is demodulated by demodulator 16 and filtered by filter 19 at the output thereof to provide an output signal 20 which desirably is a replica of the signal appearing on line 14 for extension to an ECG amplifier and/or display or the like.

Typically, the source of energy for the isolated DC power supply 18 and the isolated AC supply extended to modulator 15 via line 21 are provided by an external AC energizer circuit 22 which converts a source of DC energy to AC energy, which AC energy is applied to the primary winding of an isolation transformer 23 having its secondary winding located in the isolated portion 10 of the amplifier. The energizer 22 and the isolation transformer 23 generally comprise an AC power supply which provides AC power to the modulator 15 via conductor 21 from the transformer secondary and provides appropriately phased AC power to the demodulator 16 from the transformer primary 37 via the conductor represented by line 24.

Figure 2:
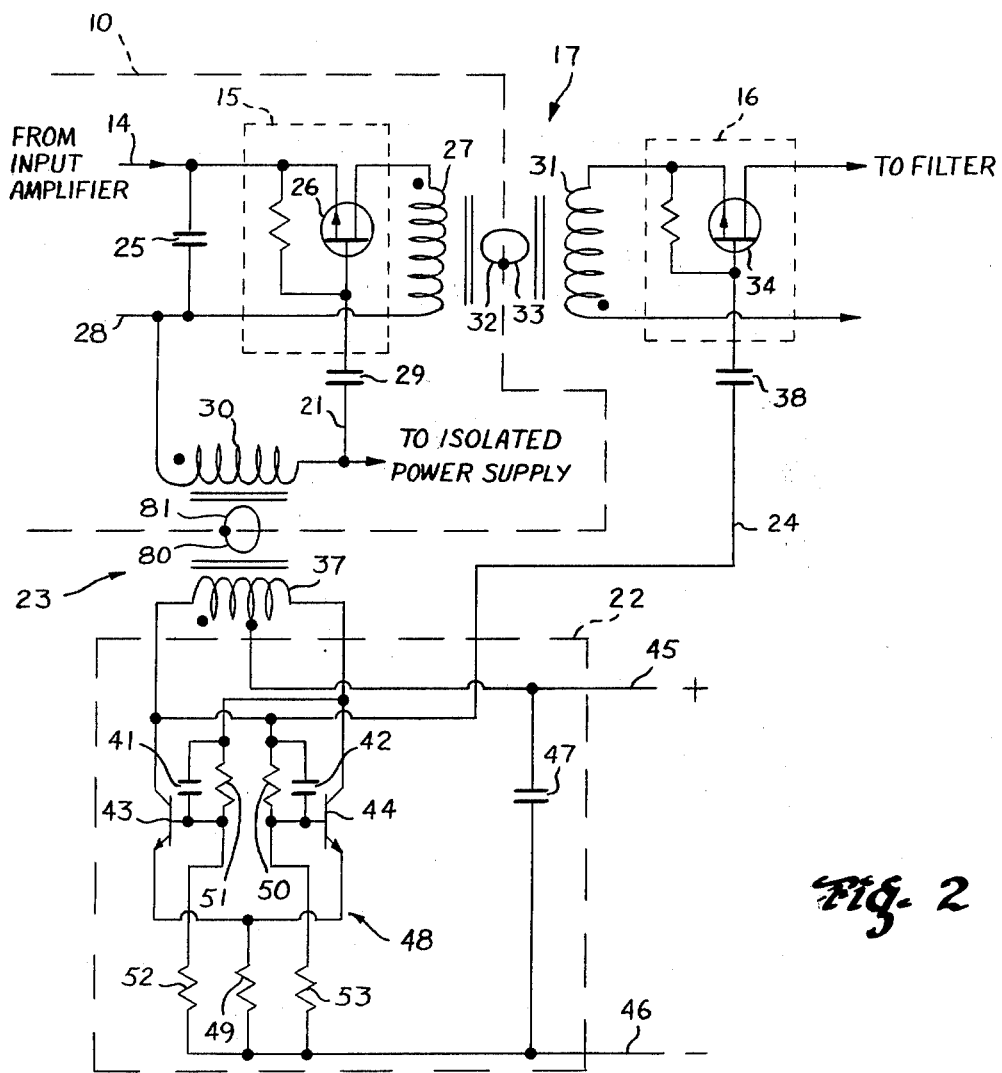
FIG. 2 is a partial schematic diagram of the amplifier illustrated in FIG. 1 showing the inter-connection of those elements relevant to an understanding of the present invention.

Referring now to FIG. 2 for more detailed description of those portions of the isolation amplifier pertinent to an understanding of the invention, it will be initially noted that modulator 15, isolation transformer 17, and demodulator 16 may comprise circuitry and structure known in the prior art. A bypass capacitor 25 is connected across the output of amplifier 12 and across the input of modulator 15. Modulator 15 comprises a half-wave modulator using a FET switch 26 with the DC input signal applied via line 14 to the source electrode thereof. The drain electrode is connected to one end of the primary winding 27 of the isolation transformer 17, the other end of which is connected to a floating reference 28 to which one end of bypass capacitor 25 is connected. Actuation of the FET switch 26 is controlled by the 100 kHz AC signal extended to the gate electrode thereof via line 21 and coupling capacitor 29 from the secondary winding 30 of isolation transformer 23. The opening and closing of FET switch 26 at the 100 kHz rate creates a modulated carrier in the primary winding 27 of modulator 15. In an ideal situation the AC control voltage appearing at the gate of FET 26 would be a symmetrical square wave having infinitesimally small rise and fall times. However, as will be hereinafter discussed, such an idealized situation has been far from realized in the prior art.

The primary 27 of transformer 17 is coupled to the secondary winding 31 by a pair of series-connected back-to-back single-turn windings 32, 33 and develop in secondary 31 a modulated carrier the pulses of which have an amplitude corresponding to the magnitude of the DC signal on input lead 11 and as subsequently amplified on lead 14.

Figure 3:
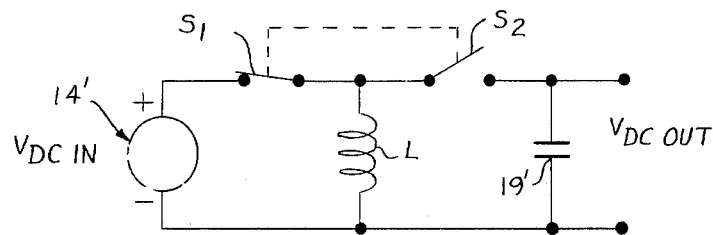
FIG. 3 is a symbolic schematic of the modulator and demodulator and including the common inductive coupling element therebetween.

The modulated AC signal on secondary winding 31 is directed to a half wave phase-sensitive demodulator 16, also utilizing a FET switch 34, which serves to produce a DC output signal corresponding to the AC amplitude of the modulated carrier signal and thereby corresponding to the original DC signal applied at the input 11 with a moderately higher power level in accordance with the amplification provided by amplifier 12. With further reference to FIG. 3, the demodulator 16 is, like modulator 15, effectively a series switch, opened and closed alternately, in synchronism with the carrier frequency. The switching action is controlled by the AC signal originating with the DC to AC energizer 22 and, for the modulator 15, also the isolation transformer 23. The switches S1 and S2 of the circuits illustrated in the FIG. 3 correspond with the FET switches 26 and 34 respectively of the modulator 15 and demodulator 16 respectively. The inductor L is alternately representative of the primary 27 and the secondary 31 of the isolation transformer 17. The source of DC input voltage 14' corresponds with the input signal for modulator 15 appearing on line 14. Similarly, the capacitor 19' across the output of the circuit of FIG. 3 is illustrative of at least a portion of the filter 19 of FIG. 1.

Figure 4A:
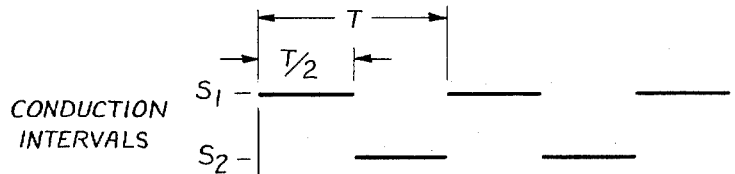
FIG. 4A is a timing diagram of the conduction intervals of the switches of FIG. 3.
Figure 4B:
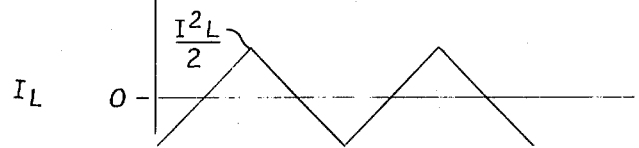
FIG. 4B illustrates the current in the inductor of FIG. 3 in accordance with the timing intervals of FIG. 4A.
Figure 4C:
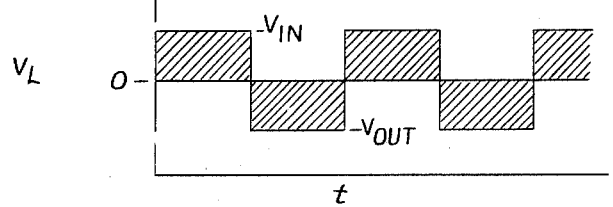
FIG. 4C is a time-plot of the voltage across the inductor in FIG. 3 in accordance with the timing intervals of FIG. 4A.

Referring further to the illustrative circuit of FIG. 3 with further reference to the timing diagrams and waveforms of FIGS. 4A, 4B and 4C, there is illustrated an idealized mode of operation of the modulator and demodulator represented by the switches S1 and S2 respectfully. Control of the switches S1 and S2 is ideally such that switch S1 is closed for the first half of each AC cycle and opened for the remainder of the cycle and switch S2 is open for the first half of the cycle and closed for the remaining half. This mode of switch control is illustrated in FIG. 4A in which the period of a full AC cycle was represented by T and switch 1 is closed to conduct during one half (T/2) of the cycle and switch S2 is closed to conduct during the latter half (T/2) of the cycle. Such control presumes an ideal square wave applied by the AC power supply to the respective gate electrodes of FET elements 26 and 34. Assuming the idealized control illustrated in FIG. 4A and assuming a particular constant magnitude of the DC input signal 14' at least during one AC cycle, as illustrated in FIG. 4C, the current into inductor L increases in a linear manner as illustrated in FIG. 4B. Because the average voltage across the inductor L over a complete cycle must be zero, the output voltage ($V_{out}$) equals the input voltage ($V_{in}$) when the half cycles are exactly equal.

In accordance with the foregoing discussion, it will be seen that the voltage appearing at the output of the isolation amplifier may bear an exact or least predetermined magnitude relationship to the input voltage for the purpose of faithful reproduction of the input signal. However in practice, some degradation of the output signal relative to the input signal has been experienced. While possibly tolerable in some applications, such degradation of the input signal may generally not be tolerable in certain medical applications such as ECG monitoring where the faithful reproduction of the sensed signal is quite important. In accordance with the present invention it is believed that such degradation of the signal in its transfer from the input portion of the isolation amplifier to the output portion arises due to a combination of two factors seen in the following discussion and illustrated in FIGS. 5A, 5B, 5C, 5D, 5E, 6 and 7.

Briefly, common mode inteference or noise signals 36 are coupled to the AC power supply circuitry through stray capacitance $C_s$ appearing in the system. The stray capacitance $C_s$ is any stray capacitance connected to the FET control electrode and a source of noise. For example, the electrode leads represented by line 11 from the patient 35 may pick up high frequency noise from various sources. This noise voltage 36 is illustrated in FIG.

6 as being extended to the isolated circuitry and shielding generally represented by the input portion X and is further coupled to the AC power supply circuitry via the stray capacitance $C_s$. Because the interference signal 36 is coupled to the AC circuitry via stray capacitance $C_s$, only the relatively higher frequencies thereof are passed, however they are generally sufficient to introduce an interfering current to the normal AC power supply.

Typically, the prior art isolation amplifiers have utilized a free running multivibrator oscillator for converting a DC supply of energy to a pulsating AC supply having a generally square wave form developed across the primary 37 of the isolation transformer 23. It is this generally square wave AC supply which is coupled by the transformer 23 via its secondary winding 30 and lead 21 to the gate of FET 26 and via lead 24 from one end of the primary winding 37 through coupling capacitor 38 to the gate electrode of FET 34. The primary 37 of transformer 23 is coupled to the secondary winding 30 by a pair of series-connected back-to-back single turn winding 80 and 81. The AC power supply normally presents an impedance $Z_{acps}$ indicated by block 38 of FIG. 6 which may be seen when looking across the primary winding 37 of isolation transformer 23. The oscillator of the prior art AC power supply operated in a manner which did not necessarily provide for extremely rapid rise and fall times of the resulting AC square wave 39 in FIG. 6, the dotted portion being representative of the prior art.

Instead, the switching operation of the semi-conductors associated with the prior art oscillator was sufficiently slow that a relatively long interval of relatively high impedance occurred during each half AC cycle from the transition of one amplitude extreme to the other, as represented by the dotted line in FIG. 8A. When one or the other of a complementary pair of switches which typically make up a multivibrator oscillator is conducting, the power supply impedance 38 is relatively low and any additional current introduced by the interference signal 36 through the reactance of stray capacitance $C_s$ has little or no effect on the control voltage 40 (FIG. 5A) applied to the control elements of the modulator and demodulator represented by switches S1 and S2 respectfully of FIG. 3. However, for certain prior art oscillators, the speed of switching of the complementary switches is sufficiently slow and the corresponding impedance sufficiently high during that switching interval that the interference current resulting from interference signal 36 may have a disturbing effect on the resultant AC control voltage 40 appearing at the junction 40' of FIG. 6.

This effect may be further understood with reference to FIG. 7 in which the impedance 38 of the AC power supply is represented by a capacitance $C_i$ which capacitance is connected in series with the stray capacitance $C_s$ between the source of interference voltage 36 and the normal AC control voltage $V_{acps}$. The junction between capacitors $C_s$ and $C_i$ corresponds with the junction 40' in FIG. 6 in which the AC control voltage actually seen by the gate electrode of FET 26 (S1) appears. The capacitances $C_s$ and $C_i$ comprise a capacitive voltage divider between the two sources of the respective voltages 36 and 39. Thus, the voltage ($V_{S1}$) appearing at junction 40' is determined by the relationship $V_n(X_{ci}/X_{cs}) + X_{ci} + V_{acps}(X_{cs}/X_{cs}) + X_{ci}$, where $V_n$ and $V_{acps}$ correspond with the instantaneous magnitude of the voltages 36 and 39 respectively, $X_{ci}$ corresponds with the reactive impedance 38 of the AC power supply and $X_{cs}$ corresponds with the reactive impedance of the stray capacitance. Typically the stray capacitance may have a value on the order of one picofarad and the capacitance $C_i$ will normally be substantially greater than $C_s$. Upon inspection of this expression it will be noted that the relative contribution of the noise voltage $V_n$ to the total voltage appearing at junction 40' is greater in the situation in which the impedance $X_{ci}$ is the greater of two possible values, that greater value being commensurate with the period during switching of the complementary switches in the oscillator and the lower of the two values being commensurate with full conduction of one of the two complementary switches during the interval of peak AC amplitude.

Figure 5A:
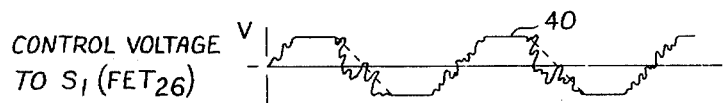
FIG. 5A depicts the prior art waveform of the control voltage applied to the control elements of the switches represented in FIG. 3.
Figure 5B:
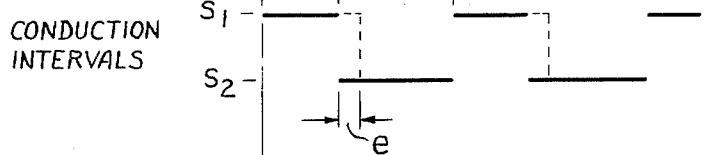
FIG. 5B is an illustration similar to that of FIG. 4A in accordance with the prior art.
Figure 5C:
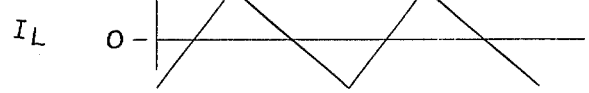
FIG. 5C is a waveform illustration similar to FIG. 4B in accordance with the prior art.
Figure 5D:
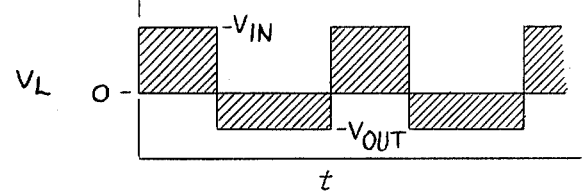
FIG. 5D is an illustration similar to FIG. 4C in accordance with the prior art.

Referring to FIG. 5A, it is seen that the AC voltage 40 for controlling the gate of FET 26 (and correspondingly the inverse thereof for controlling the gate of FET 34), no longer exhibits the linear rise and fall time ramps (illustrated by dotted lines therein) but instead includes the rapidly varying amplitude of the common mode interference signal coupled through the stray capacitance. As a result of the occurrence of this noise signal on the control voltage during the transition between the opposite AC amplitude extremes, there arises the secondary problem that the zero-crossing point of the control voltage may no longer occur exactly at the T/2 point in the AC cycle or for that matter at a repetitively predictable displacement, $e$, therefrom. Instead, the control voltage 40 may cross the zero reference level commensurate with turn-on or turn-off of a respective switch 26 or 34 at a time in the AC cycle which deviates from the T/2 midpoint by the incremental value,$e$. Because the noise is of random value, the value of $e$ may vary by a value of $\pm$ several tenths of a percent or more (shown exagerated herein) of the AC interval T about the T/2 midpoint. Thus, assuming the situation illustrated in FIG. 5A, the switch S1 (FET 26) conduction interval will be $[(T/2) - e]$ and the conduction interval of the switch S2 (FET 34) will be $[(T/2) + e]$ as illustrated in FIG. 5B. Because of this nonsymmetrical and variable interval of conduction between the modulator and demodulator switches during the first and second portions of the AC cycle, the output voltage from the demodulator represented as $V_{out}$ in FIG. 5D no longer necessarily has the same relationship to the input voltage to the modulator 15 represented as $V_{in}$ in FIG. 5D. More importantly, because of the variability of the noise, the relation of $V_{out}$ to $V_{in}$ may vary with each successive cycle the AC power supply. Thus, the output signal from the isolation amplifier is no longer a faithful or even predictable and thereby adjustable reproduction of the input signal to the isolation amplifier. The recognition of this problem and the resulting solution thereto comprise the essence of the subject invention.

Attention is now returned to the AC power supply 22 of FIG. 2 incorporating the improved circuitry of the invention. The external power supply 22 incudes, in the main, a oscillator similar in most respects to the oscillator disclosed in the aforementioned U.S. Pat. No. 3,946,324 with the notable exception that means are provided, here speed-up capacitors 41 and 42, for improving the operation and switching speed of the complementary pair of transistors 43 and 44 to minimize the adverse effect of the common mode interference on the AC control voltage.

A pair of power connection terminals 45 and 46 are connected across a source of DC power (not shown) as the power inputs to AC power supply 22. It is preferable that the DC power supply be regulated and accordingly capacitor 47 is illustrated as aiding in the regulation of the DC power supply. The oscillator, here generally represented as 48, comprises a free running multivibrator having a pair of transistors 43 and 44 for complementary operation with their respective collectors connected to respective opposite ends of the primary winding 37 of isolation transformer 23 and having their respective emitters connected in common through a current limiting resistor 49 to the negative DC supply potential appearing on line 46. The positive DC supply potential is extended via line 45 to a center tap of the primary winding 37 of transformer 23. In accordance with the conventional circuitry utilized in prior art multivibrator oscillators associated with isolation amplifiers, the transistors 43 and 44 are cross-coupled from a respective collector to a respective opposite base by means of resistors 50 and 51 respectively to provide the requisite regenerative feedback. Biasing resistors 52 and 53 connected to the bases of transistors 43 and 44 respectively cooperate with resistors 51 and 50 respectively in providing the requisite bias and stabilization of the respective transistors. The values of resistors 51, 52, 50 and 53 are selected to provide symmetrical operation, however such operation even if symmetrical does not necessary result in the rapid rise and fall times required in the resulting AC square wave pulses to avoid interference from the common mode noise signals. The overall period of the oscillatory circuit comprises the oscillator 48 is determined by the inductance of the primary winding 37 of transformer 23 as well as by the values of resistors 50, 51, 52, 53 and 49. The general operation of a free running multivibrator oscillator is sufficiently well understood that further explanation thereof is limited to the inventive aspect of the present circuit.

The interval during which one of transistors 43 and 44 goes from full conduction to non-conduction is normally limited by the rate in which the biasing voltage at the respective base changes which in turn is a function of and limited by the inherent capacitance between the collector and emitter of the transistor being cut off and the base to emitter capacitance of the transistor being turned on.

Because of the delay in turning on the previously non-conducting transistor and the fact that current conduction following turn-on does not immediately reach a maximum, the impedance of the power supply circuit as viewed across the primary winding 37 will temporarily increase as represented by the dotted line designated PRIOR ART in FIG. 8A, following cut-off of the conducting transistor and prior to and during initiation of conduction in the previously non-conducting transistor. It is during this interval of relatively higher impedance that the noise signal 36 is most disruptive of the AC control voltage applied to the modulator and demodulator.

In the embodiment illustrated in FIG. 2, the disruptive effect of the noise signal 36 is minimized by the addition of speed-up capacitors 41 and 42 in the cross-coupling networks of the oscillator 48 to significantly accelerate the turn-off of the conducting transistor and the turn-on of the non-conducting transistor. For example, where resistors 50 and 51 each have a value of 10 kilohms and the resistors 52 and 53 each have a value of 1 kilohms, speed-up capacitors 41 and 42 each having a value of 47 picofarads are connected in parallel with the resistors 51 and 50 respectively. The speed-up capacitors 41 and 42 are sized principally to compensate for the turn-on delay introduced by the base to emitter capacitance of the non-conducting transistors. The value of a speed-up capacitor 41 or 42 should be approximately large enough to compensate the respective resistor attenuator 51, 52 or 50, 53 respectively, however care should be taken not to make the value of a speed-up capacitor 41 or 52 too large in order to avoid over-compensation and resultant distortion to the waveform.

In the illustrated example, the output square wave from the oscillator 48 operated without speed-up capacitors 41, 42 might typically have a rise and/or fall time of about 1 microsecond or more, whereas the inclusion of the speed-up capacitors reduces such rise and fall times to about 0.2 – 0.4 microseconds, thereby significantly reducing the interval of possible variation, $e$, of the modulator and demodulator conduction cycles from the T/2 midpoint. Such reduction in the interval, $e$, necessarily minimizes the interval of increased impedance between amplitude extremes of the AC cycle as represented by the solid line plot 55 in FIG. 8A thereby minimizing the interval, $e$, over which the common mode noise may interfere with the balanced conduction cycles of the modulator and demodulator, thus resulting in significantly increased fidelity of the signal provided at the output of the isolation amplifier.

Figure 9:
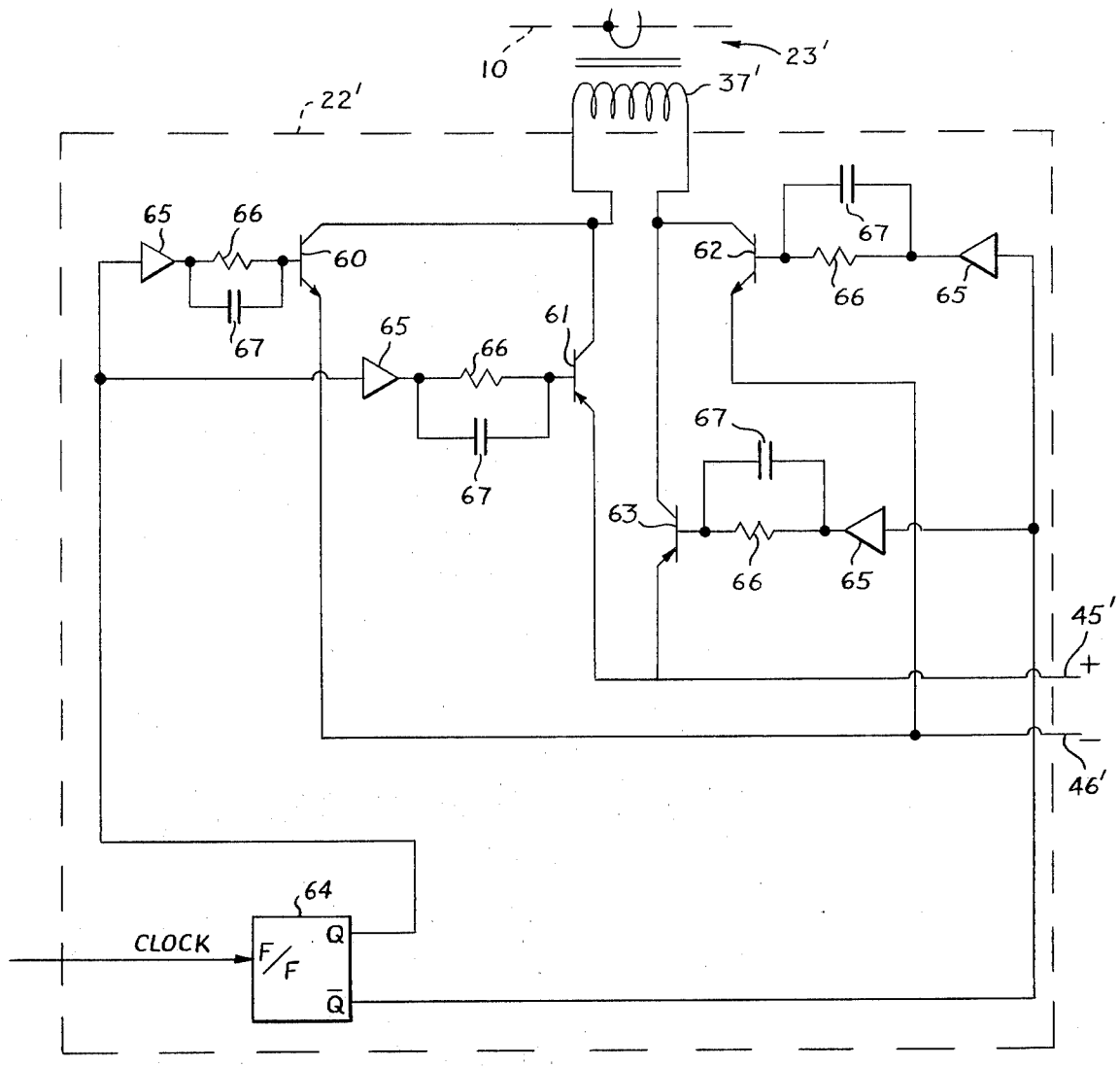
FIG. 9 is a schematic illustration of an alternative to the improved AC power supply circuitry illustrated in FIG. 2.

The DC to AC energizer circuit 22' of FIG. 9 represents an alternative embodiment to that illustrated in FIG. 2. The primary 37' of isolation transformer 23' corresponds generally with the primary 37 of isolation transformer 23 with the exception that the primary winding 37' does not include a center tap. In the embodiment of FIG. 9, a regulated DC power supply (not shown) connected across the power terminals 45' and 46' is controlled in a manner such that current flows through the entire primary 37' in one direction during one half of the AC cycle and in the other direction during the remaining half of the AC cycle. This control of current flow is effected by a transistor-switch bridge network in which a pair of complementarily-operating transistors 60 and 61 have their respective collectors connected to one end of primary winding 37' and another pair of complementarily-operating transistors 62 and 63 have their respective collectors connected to the other end of the primary winding. Unlike the pair of complementary operating transistors 43 and 44 in FIG. 2 which were connected to opposite ends of primary 37 and thus were of the same conduction type (i.e. npn), a complementary pair of transistors 60, 61 or 62, 63 in the circuit of FIG. 9 is comprised of a pair of transistors of opposite conduction types (i.e. npn and pnp). The emitters of npn transistors 60 and 62 are connected in common to the negative DC voltage terminal 46' and the emitters of pnp transistors 61 and 63 are connected in common to the positive DC terminal 45'. Thus it will be appreciated that if transistors 60 and 63 are biased into full conduction while transistors 61 and 62 are cut-off, current will flow in one direction through primary winding 37' whereas full conduction through transistors 61 and 62 with transistors 60 and 63 cut off results in current flow in the opposite direction through the primary winding.

To obtain the requisite conduction control of a particular pair of transistors connected in series with primary winding 37' across the DC power supply, biased control of the base electrodes of the various transistors 60, 61, 62 and 63 is effected by a low power square wave generator such as the output of a flip-flop 64 which is synchronously clocked at a 200 kHz rate. The $\overline{Q}$ output of flip-flop 64 is extended to the bases of transistors 60 and 61 for complementary control of those two transistors during alternate half cycles of the AC cycle and the Q output of the flip-flop is extended to the bases of transistors 62 and 63 for similar control during the complementary half cycle of each AC cycle. A series resistor 66 in each of the respective base circuits of the respective transistors 60, 61, 62 and 63 control the base current to the respective transistors when they conduct. Separate capacitors 67 in parallel with each of the respective resistors 66 perform a speed-up function during the switching operation similar to that provided by capacitors 41 and 42 in the FIG. 2 illustration. Separate buffers or driver circuits 65 preceeding each of the parallel resistance capacitance (66, 67) circuits assure ample base current to the respective transistors from the output of flip-flop 64.

By using an external square wave drive such as flip-flop 64 for controlling the switching operation of the power switches in the AC power supply, the circuit designer is free to optimize the RC drive circuits 66, 67 to their respective transistors 60, 61, 62 or 63 with a greater degree of flexibility than was true in the FIG. 2 embodiment in which the parameters of the various circuit elements were somewhat limited to those required to obtain the 100 kHz oscillating frequency.

The presence of speed-up capacitors 67 in the respective base circuits of transistors 60, 61, 62 and 63 serve to expedite the turn-on of the respective transistor such that it rapidly reaches saturation. On the other hand, the transistors presently in conduction and being switched to non-conduction by the appropriate output of flip-flop 64 do so in a manner which is relatively slow and essentially following turn-on and saturation of the newly conducting transitor such that the impedance $Z_{acps}$ increases relatively little during this transition as represented by the solid line waveform 70 in the impedance plot of FIG. 8A. This relatively slow turn-off of the previously conducting pair of transistors is due to the storage time of the respective transistors due to their having been in saturation and possessing a degree of collector storage. Although the capacitance in the respective base circuit of the transistor being turned-off might normally be considered to reduce this storage time, it is selected such that it does not limit the storage time to an extent that there is no longer a useful overlap between turn-on of one switch and turn-off of another. Typically, the speed-up capacitors 67 might have values in the order of 100's of picofarads.

The waveform illustrated in FIG. 8B is generally similar to that illustrated in FIG. 5A representing the AC voltage appearing at junction 40' for controlling the modulator and demodulator with the notable exception that the interval during which the transition between AC amplitude extreme occurs is significantly lessened in accordance with the present invention.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. In an isolation amplifier for providing a high degree of conductive isolation between its input and output and for amplifying low level DC input signals, the amplifier comprising: an input portion for receiving the DC input signal and including an AC energized modulator to produce an AC signal substantially corresponding to the DC input signal, an output portion for receiving the AC signal from the input portion and including a phase sensitive demodulator to produce a corresponding, relatively amplified DC output signal, first circuit means for inductively non-conductively coupling said AC signal from said input portion to said output portion, an AC power portion for producing an AC energizing signal for said modulator and said demodulator, said power portion including means having a pair of terminals for connection across a source of DC power for generating said AC energizing signal and second circuit means comprising a transformer having a secondary winding in said input portion and having its primary winding operatively connected in said power portion for non-conductively coupling the AC energizing signal from said AC energizing signal generating means to said input portion to activate said modulator, third circuit means for coupling the AC energizing signal from said power portion AC signal generating means to said output portion to activate said demodulator, said AC power portion exhibiting relatively low impedance during the opposite amplitude extremes of the AC cycle and normally a relatively higher impedance during the transition between the opposite amplitude extremes, the coupling of common mode interference signal sources through stray capacitance to said AC power portion being operative during said normally higher impedance thereof to modify the output voltage therefrom sufficiently to possibly interfere with the accurate reproduction of the input signal as the DC output signal;

the improvement wherein said AC energizing signal generating means of said AC power portion comprises a pair of complementary switch means actuable for alternately and oppositely connecting a source of DC power to said transformer primary to provide said AC energizing signal, each switch means of said complementary pair comprising a separate pair of semi-conductor switches having at least three electrodes including a control electrode, one switch of each said separate pair being connected intermediate one end of said transformer primary and one DC power source terminal and the other switch of said separate pair being connected intermediate the other end of said transformer primary and the other DC power source terminal, and means for controlling the conduction and non-conduction of said complementary pair of switch means, said switch conduction controlling means including means for generating a pair of square wave control signals of opposite polarity having relatively fast rise and fall times and means for connecting said square wave control signals of one polarity to the control electrodes of the switches comprising one switch means of the complementary pair and said square wave control signals of the opposite polarity to the control electrodes of the switches comprising the other switch means of the complementary pair such that substantially full conduction through one switch means of said complementary pair is at least substantially concurrent wit significantly reduced conduction through the other switch means of said complementary pair, thereby minimizing both the increase of impedance of said AC power portion during said transition and the interval during which said impedance increase exists.

2. The amplifier of claim 1 wherein said means connecting said square wave control signals to the respective control electrodes of said semi-conductor switches respectively comprise a parallel combination of resistance means and speed-up capacitance means.

3. The amplifier of claim 2 wherein the rise and fall times of said square wave control signal and the time constant of said parallel combination of resistance means and speed-up capacitance means are such that the rise and fall times of said AC energizing signal are each less than about 0.5 microsecond.

* * * * *